(12) United States Patent
Yoshimura et al.

(10) Patent No.: US 11,227,748 B2
(45) Date of Patent: Jan. 18, 2022

(54) PLASMA TREATMENT DEVICE AND STRUCTURE OF REACTION VESSEL FOR PLASMA TREATMENT

(71) Applicants: CORE TECHNOLOGY, INC., Iruma (JP); ASKAGI CORPORATION, Fukuoka (JP)

(72) Inventors: Toshiaki Yoshimura, Iruma (JP); Hiroyuki Minowa, Iruma (JP); Lung Kei Amos Shek, Iruma (JP)

(73) Assignees: CORE TECHNOLOGY, INC., Saitama (JP); ASKAGI CORPORATION, Fukuoka (JP)

( * ) Notice: Subject to any disclaimer, the term of this patent is extended or adjusted under 35 U.S.C. 154(b) by 232 days.

(21) Appl. No.: 16/080,232

(22) PCT Filed: Mar. 3, 2016

(86) PCT No.: PCT/JP2016/056683
§ 371 (c)(1),
(2) Date: Aug. 27, 2018

(87) PCT Pub. No.: WO2017/149738
PCT Pub. Date: Sep. 8, 2017

(65) Prior Publication Data
US 2019/0019656 A1   Jan. 17, 2019

(51) Int. Cl.
*H01J 37/32* (2006.01)
*C23C 16/509* (2006.01)
(Continued)

(52) U.S. Cl.
CPC .. *H01J 37/32541* (2013.01); *C23C 16/45565* (2013.01); *C23C 16/509* (2013.01);
(Continued)

(58) Field of Classification Search
USPC ...... 118/723 E, 723 ER; 156/345.43–345.47; 315/111.21
See application file for complete search history.

(56) References Cited

U.S. PATENT DOCUMENTS 4,534,816 A * 8/1985 Chen ............... H01J 37/3244
156/345.37
5,270,266 A * 12/1993 Hirano ............. H01J 37/3244
438/715
(Continued)

FOREIGN PATENT DOCUMENTS

CN   101308779 A   11/2008
CN   102597306 A   7/2012
(Continued)

OTHER PUBLICATIONS

Office Action dated Sep. 11, 2018 from corresponding Japanese Application No. JP 2018-502464 and English translation.
(Continued)

*Primary Examiner* — Rakesh K Dhingra
(74) *Attorney, Agent, or Firm* — Lucas & Mercanti, LLP

(57) ABSTRACT

The present invention improves the in-plane uniformity of films formed via a plasma treatment. It is provided a plasma treatment device comprising: an electrode plate arranged in a reaction vessel; a counter electrode arranged parallel so as to opposite to the electrode plate in the reaction vessel; a transmission plate to supply frequency power to the electrode plate from outside of the reaction vessel, the transmission plate being connected from non-opposite side not opposing to the counter electrode of the electrode plate; and an insulator with a container shape, the insulator being arranged in the reaction vessel and storing the electrode plate therein; wherein the non-opposite side of the electrode plate closely contacts to an inner bottom surface of the insulator with the container shape, wherein a side surface of
(Continued)

the electrode plate closely contacts to an inner side surface of the insulator with the container shape, and wherein a hole edge portion of the insulator with the container shape is formed so as to protrude toward a counter electrode side.

12 Claims, 11 Drawing Sheets

(51) Int. Cl.
  *H05H 1/46* (2006.01)
  *H05H 1/24* (2006.01)
  *C23C 16/455* (2006.01)
(52) U.S. Cl.
  CPC .. *H01J 37/32183* (2013.01); *H01J 37/32449* (2013.01); *H01J 37/32467* (2013.01); *H01J 37/32568* (2013.01); *H01J 37/32577* (2013.01); *H01J 37/32651* (2013.01); *H01J 37/32752* (2013.01); *H05H 1/24* (2013.01); *H05H 1/46* (2013.01); *H01J 2237/3321* (2013.01)

(56) References Cited

U.S. PATENT DOCUMENTS

| | | | | |
|---|---|---|---|---|
| 5,919,332 | A * | 7/1999 | Koshiishi | C23C 16/5096 |
| | | | | 118/723 E |
| 5,926,737 | A * | 7/1999 | Ameen | H01L 21/28518 |
| | | | | 438/649 |
| 6,391,787 | B1 | 5/2002 | Dhindsa et al. | |
| 2003/0205202 | A1* | 11/2003 | Funaki | C23C 16/4404 |
| | | | | 118/723 E |
| 2004/0235191 | A1* | 11/2004 | Hasegawa | C23C 16/45523 |
| | | | | 436/518 |
| 2006/0090700 | A1* | 5/2006 | Satoh | C23F 4/00 |
| | | | | 118/715 |
| 2007/0026540 | A1* | 2/2007 | Nooten | H01L 29/66181 |
| | | | | 438/5 |
| 2009/0200269 | A1* | 8/2009 | Kadkhodayan | H01J 37/16 |
| | | | | 216/71 |
| 2011/0165057 | A1* | 7/2011 | Honda | H01J 37/32541 |
| | | | | 423/446 |
| 2012/0180810 | A1 | 7/2012 | Beckmann et al. | |
| 2014/0283746 | A1* | 9/2014 | Seo | H01J 37/32495 |
| | | | | 118/723 R |
| 2015/0270119 | A1* | 9/2015 | Yahata | H01J 37/32449 |
| | | | | 438/758 |

FOREIGN PATENT DOCUMENTS

| | | |
|---|---|---|
| JP | H06-005522 A | 1/1994 |
| JP | H06151411 A | 5/1994 |
| JP | 2002313743 A | 10/2002 |
| JP | 2004-052045 A | 2/2004 |
| JP | 2008091805 A | 4/2008 |
| JP | 2008211243 A | 9/2008 |
| JP | 2011-204995 A | 10/2011 |
| JP | 2012023394 A | 2/2012 |
| WO | 2011155479 A1 | 12/2011 |

OTHER PUBLICATIONS

Office Action dated Feb. 5, 2019 for Japanese Patent Application No. 2018-502464 and English machine translation.
International Search Report dated Jun. 14, 2016 for PCT/JP2016/056683 and English translation.
CNIPA, Office Action for the corresponding Chinese patent application No. 201680083051.2, dated Mar. 25, 2020, with English translation (21 pages).

* cited by examiner

PLASMA TREATMENT DEVICE AND STRUCTURE OF REACTION VESSEL FOR PLASMA TREATMENT

CROSS REFERENCE TO RELATED APPLICATION

This Application is a 371 of PCT/JP2016/056683 filed on Mar. 3, 2016, which is incorporated herein by reference.

TECHNICAL FIELD

The present invention relates to a plasma treatment device and a structure of reaction vessel for plasma treatment.

BACKGROUND ART

Recently, in production of electronic devices such as a FPD (Flat Panel Display) and a solar cell, it is widely used a PECVD (Plasma-Enhanced Chemical Vapor Deposition) technology in which a thin film is accumulated on a substrate by utilizing gas phase state formed by exciting and decomposing process gas through plasma.

The PECVD device is more advantageous than a heat CVD device at points that precise film formation can be done at a lower temperature, heat damage and mutual diffusion between layers can be suppressed, practical accumulation speed can be obtained even if material hard to be pyrolyzed is utilized, and a thin film can be formed with various composition ratios by using plural kinds of materials each of which has a different pyrolysis temperature.

On the other hand, as for in-plane uniformity of the object substrate in film formation by using the PECVD device, it is necessary to prepare various factors. Especially, in the film formation, decline of the in-plane uniformity becomes remarkable according that an area of the object substrate increases.

Here, as the factors due to which the in-plane uniformity of the object substrate declines in the film formation by using the PECVD device, there will be roughly considered in three factors. The first factor is a standing wave which occurs by adding plasma formation frequency power to a closed space under reduced pressure. The second factor is unevenness of process gas distribution within a plasma treatment space. And the third factor is the in-plane uniformity of surface temperature of the object substrate.

When the standing wave relating to the first factor occurs, even if the process gas is uniformly distributed, plaque will occur in glow discharge generated in plasma treatment space, thus film cannot be formed in a place where the standing wave occurs. (Supposed that λ is a wavelength of frequency, at every ¼λ), that is, since the standing wave corresponding to the wavelength of frequency utilized in plasma formation occurs in the plasma treatment space, interval of the standing wave becomes shorter according that the utilized frequency becomes higher. Thereby, influence becomes larger.

When the unevenness of the process gas distribution relating to the second factor occurs, bias occurs in active species occurring in the plasma treatment space even if glow discharge uniformly exists between electrodes. According that treatment area becomes larger, unevenness of process gas distribution becomes easy to be generated. Conventionally, although the process gas introduced in the plasma treatment space is supplied while passing through a shower plate in which a plurality of ventilation holes are formed and dispersed, thereby the in-plane uniformity of density of the process gas becoming material of the plasma generated on the substrate is improved, there is a problem that the process gas does not sufficiently disperse in a plane direction, film thickness formed just below a gas introduction hole becomes easy to be thick and thickness of thin film formed on the substrate becomes non-uniform.

The in-plane uniformity of surface temperature of the substrate relating to the third factor affects in film thickness distribution formed on the object substrate and film quality. As heating method, various controls divided into zones are conducted by a heater plate system utilizing resistance heating and an IR (infrared) lamp and the like.

Recently, upon request from low temperature process and area enlarging of FPD (Flat Panel Display), solar cell and semiconductor substrate, solution is attempted by various approaches to improve the in-plane uniformity in the PECVD, an ashing or etching devices and the like which are utilizing high frequency (for example, referring Patent literatures 1, 2).

CITATION LIST

Patent Literature

PTL1: Japanese Patent Application laid open No. 2008-91805
PTL2: Japanese Patent Application laid open No. 2002-313743

SUMMARY OF INVENTION

Technical Problem

However, according to approaches described in the PTL1 and PTL2 raised in the above, improvement of the in-plane uniformity of large area film formation by utilizing the PECVD device cannot be sufficiently obtained.

The present invention has been done in view of the above problem and has an object to improve the in-plane uniformity of film formation in the plasma treatment.

Solution to Problem

One embodiment of the present invention is a plasma treatment device comprising:
an electrode plate arranged in a reaction vessel;
a counter electrode arranged parallel so as to opposite to the electrode plate in the reaction vessel;
a transmission plate to supply frequency power to the electrode plate from outside of the reaction vessel, the transmission plate being connected from non-opposite side not opposing to the counter electrode of the electrode plate; and
an insulator with a container shape, the insulator being arranged in the reaction vessel and storing the electrode plate therein;
wherein the non-opposite side of the electrode plate closely contacts to an inner bottom surface of the insulator with the container shape,
wherein a side surface of the electrode plate closely contacts to an inner side surface of the insulator with the container shape, and
wherein a hole edge portion of the insulator with the container shape is formed so as to protrude toward a counter electrode side.

In the plasma treatment device constituted in the above, the electrode plate produces glow discharge by being supplied the frequency power from the transmission path and activates the process gas and produces plasma. Here, the insulator with the container shape is provided so as to cover from the non-opposite side of the electrode plate not opposing to the counter electrode. In addition, the hole edge portion of the insulator with the container shape is formed so as to protrude toward the counter electrode side. Therefore, the plasma treatment space between the electrode plate and the counter electrode is enclosed by the hole edge portion of the insulator with the container shape. Thereby, confinement of the process gas and the active species in the plasma treatment space (plasma confinement) is conducted, thereby uniformity of the process gas and the active species in the plasma treatment space can be improved. Further, it can be obtained effects of consumption saving of the process gas, low output of the frequency power supplied to the electrode plate, reduction of radiation damage due to the low output of the frequency power and the like. Further, since the insulator with container shape continuous from the hole edge portion closely contacts to the electrode plate and covers it, it can be prevented unnecessary film formation except for the inner portion (plasma treatment space) of the electrode plate covered by the insulator with the container shape and occurrence of particles can be reduced. Similarly, self-cleaning can be easily done (it is enough to conduct cleaning of only plasma treatment space), thus it can further be obtained effects of consumption reduction of self-cleaning gas, shortening of self-cleaning time and the like.

One selective embodiment of the present invention is the plasma treatment device further comprising:

an adjustment mechanism for adjusting a clearance between the electrode plate and the counter electrode;

wherein a plasma treatment is conducted under a state that the clearance between the electrode plate and the counter electrode is adjusted so that a clearance between an protrusion end of the hole edge portion and the counter electrode becomes narrower than a protrusion length protruded from a facing surface to which the electrode plate of the hole edge portion of the insulator with the container shape opposes to the counter electrode side.

According to the plasma treatment device constituted in the above, plasma confinement can be done, and based on the plasma confinement, film formation efficiency, reduction of radiation damage and reduction of particles can be remarkably improved.

One selective embodiment of the present invention is the plasma treatment device, wherein in the insulator with the container shape, a hole diameter near the hole edge portion becomes gradually wider according that the hole diameter approaches to a hole, based on a taper portion formed in an inner corner portion of the hole edge portion.

According to the plasma treatment device constituted in the above, while increasing effectiveness, a size of the object of film formation arranged in the plasma treatment space in which plasma is confined can be effectively enlarged, that is, although the portion near the hole edge portion of the insulator with the container shape corresponds to a flow out hole from which the process gas and active species flow out from the plasma treatment space, in a case of vicinity of such flow out hole, plaque of the process gas and active species is hard to be produced even if gradually widening of the hole edge portion is done and the plasma confinement space is practically widened.

One selective embodiment of the present invention is the plasma treatment device, wherein the counter electrode serves as a tray mounting an object of the plasma treatment, wherein the process gas flows out toward the counter electrode from the electrode plate, and wherein the counter electrode is formed wider than the insulator with the container shape.

According to the plasma treatment device constituted in the above, the counter electrode can be arranged with a position relation in which the counter electrode closes the whole of the hole of the insulator with container shape and a flow direction of the process gas flowing out toward the counter electrode from the electrode plate is substantially vertical to the plane direction of the electrode plate and the counter electrode, therefore the plasma confinement can be done.

Another embodiment of the present invention is a structure of reaction vessel for plasma treatment comprising:

an electrode plate arranged in a reaction vessel;

a counter electrode arranged parallel so as to opposite to the electrode plate in the reaction vessel;

a transmission plate to supply frequency power to the electrode plate from outside of the reaction vessel, the transmission plate being connected from non-opposite side not opposing to the counter electrode of the electrode plate; and an insulator with a container shape, the insulator being arranged in the reaction vessel and storing the electrode plate therein;

wherein the non-opposite side of the electrode plate closely contacts on an inner bottom surface of the insulator with the container shape, wherein a side surface of the electrode plate closely contacts to an inner side surface of the insulator with the container shape, and wherein a hole edge portion of the insulator with the container shape is formed so as to protrude toward a counter electrode side.

Here, the plasma treatment device or the structure of reaction vessel for plasma treatment includes various embodiments carried out in a combined state in the other device or carried out with the other method.

Advantageous Effects of Invention

According to the present invention, the in-plane uniformity of plasma density in the plasma treatment can be improved.

DESCRIPTION OF EMBODIMENTS

Hereinafter, with reference to the drawings, the embodiments of the present invention will be described.

Figure 1:
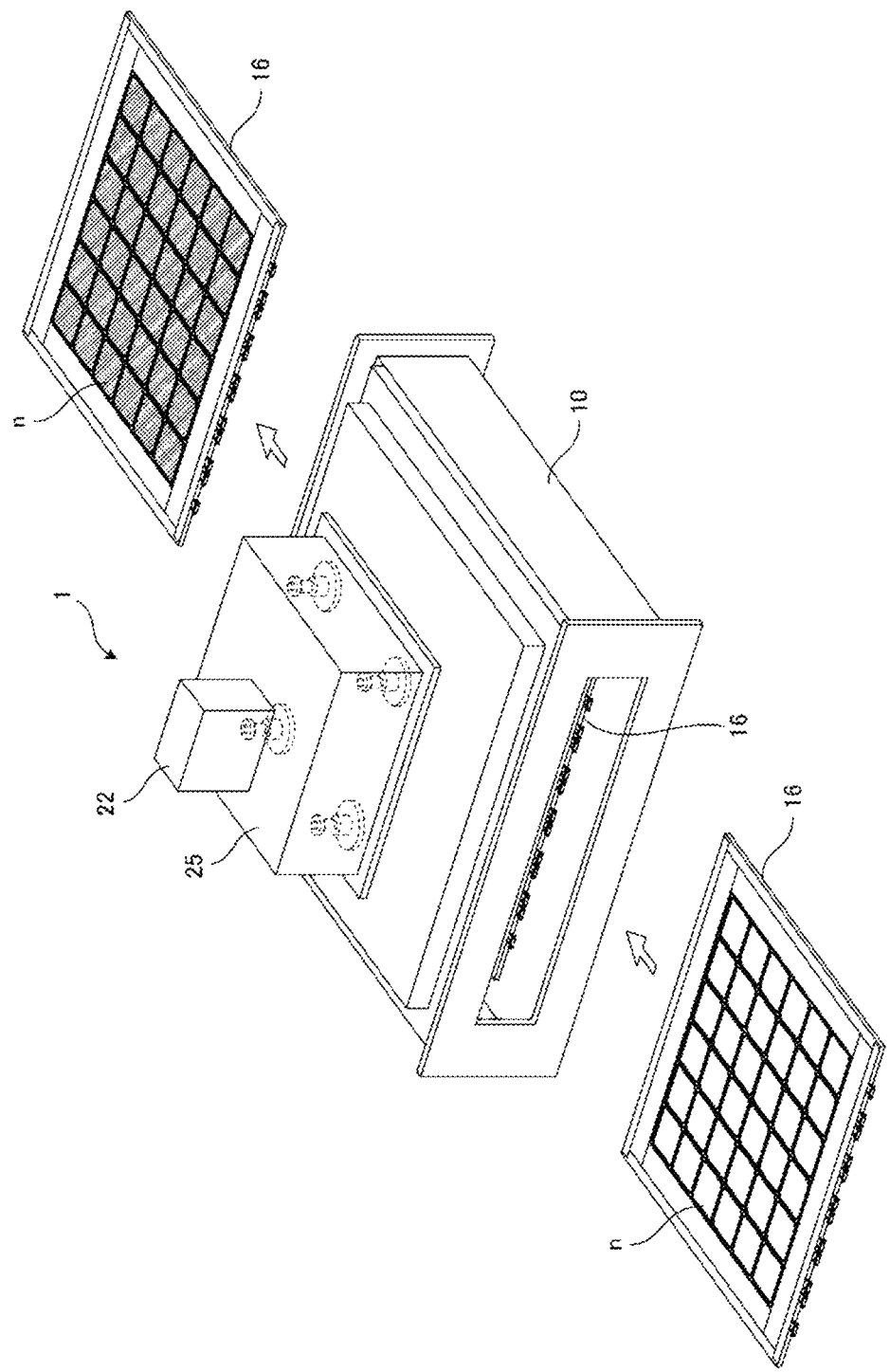
FIG. 1 is a perspective view showing a whole constitution of a plasma treatment device.
Figure 2:
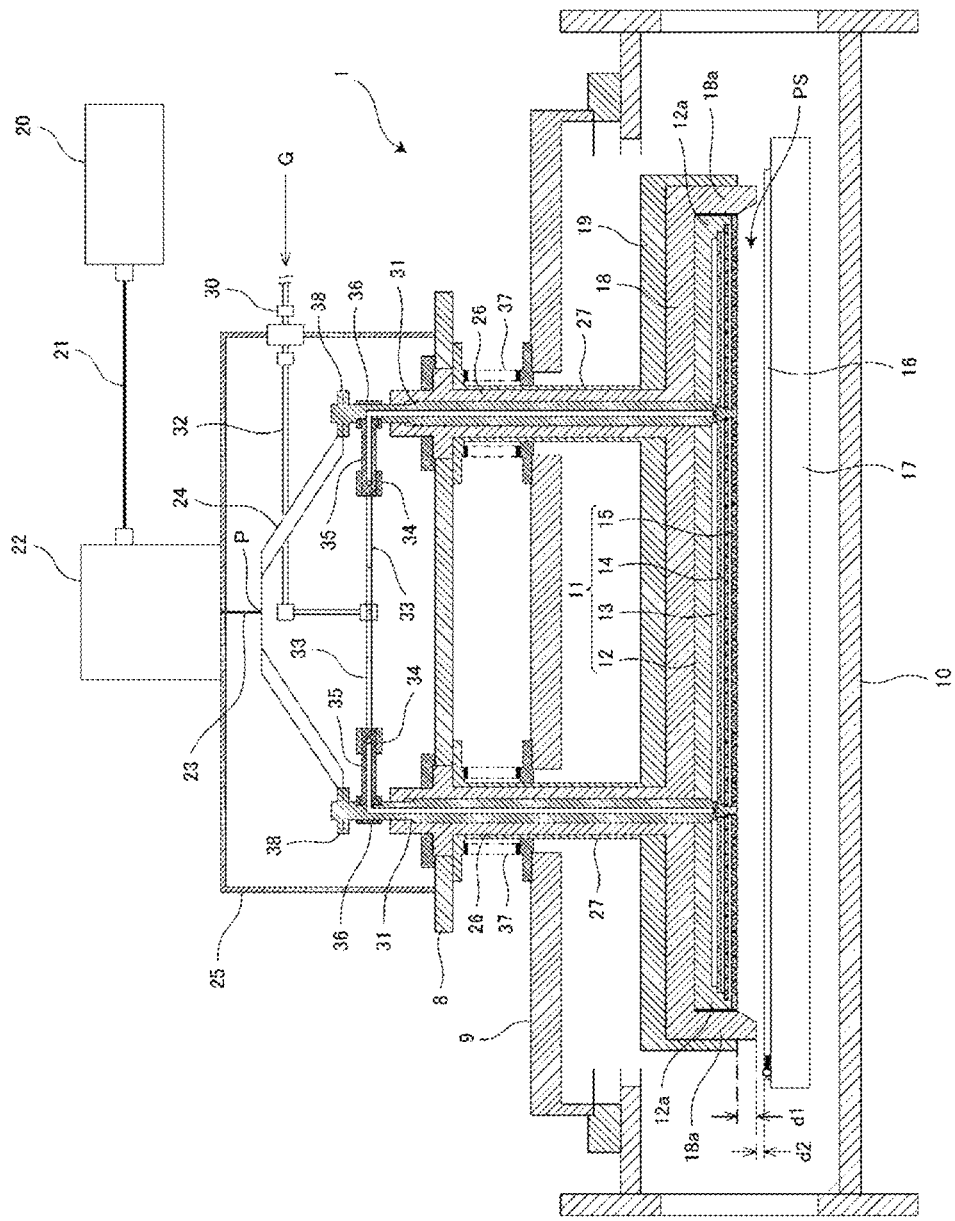
FIG. 2 is an explanatory view to explain a sectional constitution of the plasma treatment device.
Figure 3:
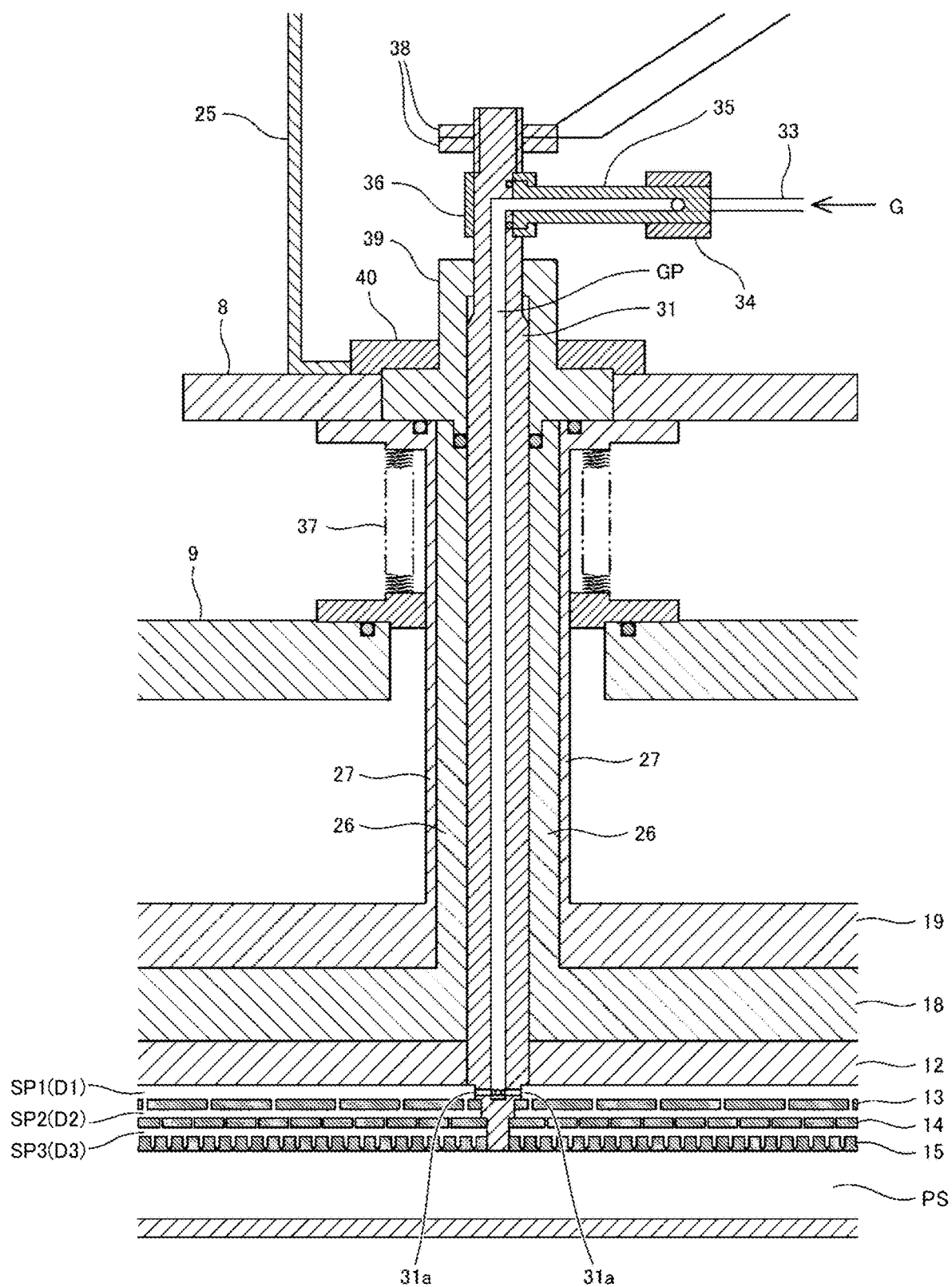
FIG. 3 is a view in which a main part of FIG. 2 is enlarged and shown.
Figure 4:
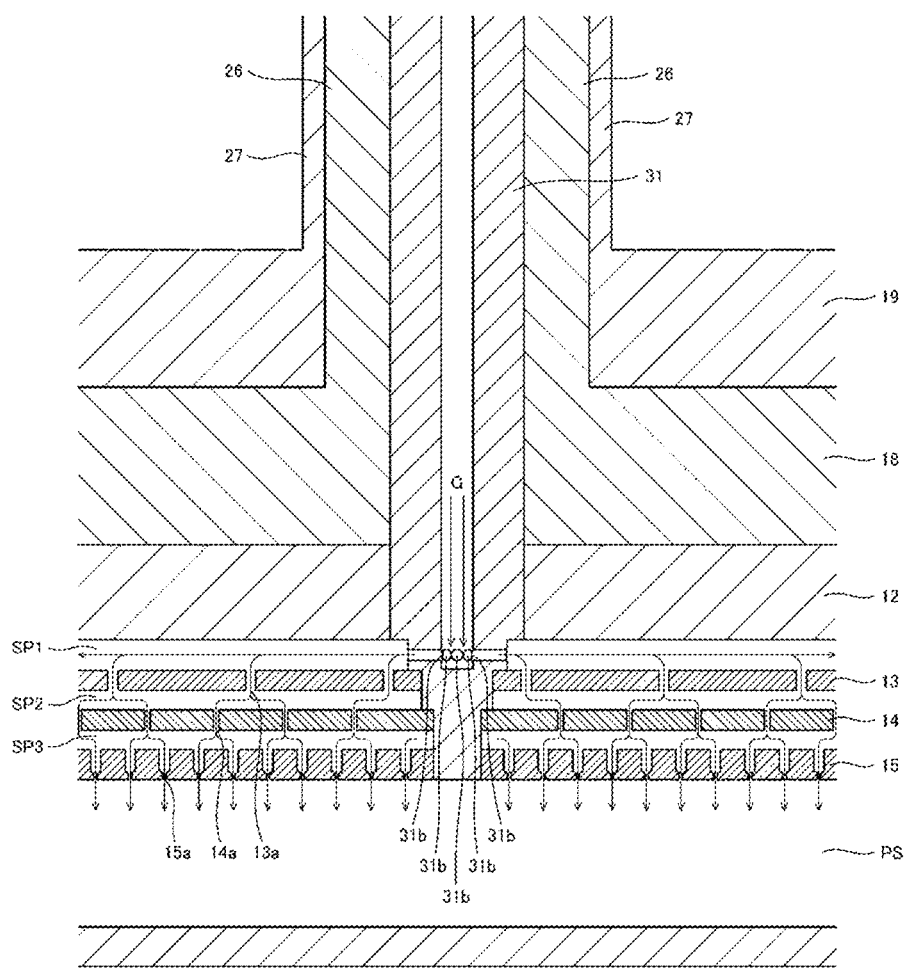
FIG. 4 is a view in which a main part of FIG. 3 is further enlarged and shown.
Figure 5:
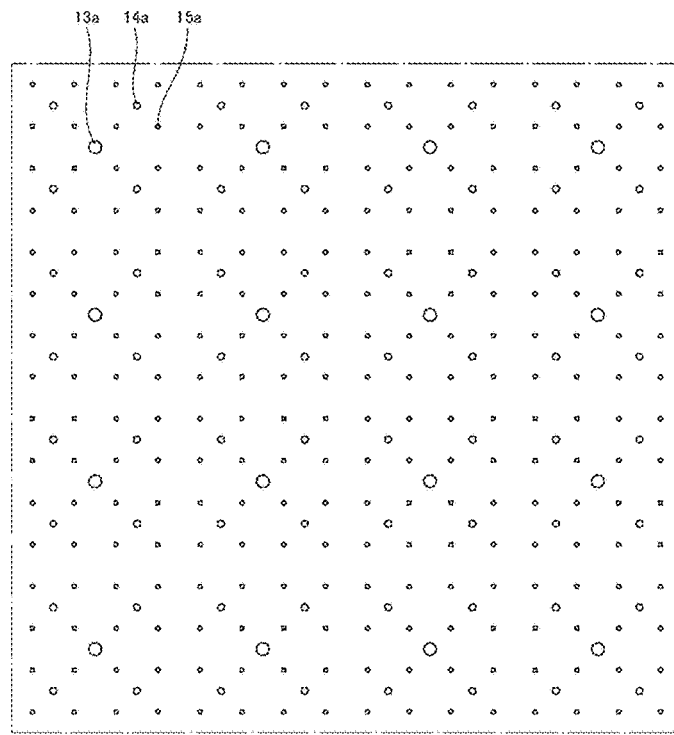
FIG. 5 is a view to explain sizes and positions of a plurality of small holes in each plate constituting an electrode plate.

FIG. 1 is a perspective view showing a whole constitution of a plasma treatment device, FIG. 2 is an explanatory view to explain a sectional constitution of the plasma treatment device, FIG. 3 is a view in which a main part of FIG. 2 is enlarged and shown, FIG. 4 is a view in which a main part of FIG. 3 is further enlarged and shown and FIG. 5 is a view to explain sizes and positions of a plurality of small holes in each plate constituting an electrode plate.

The plasma treatment device 1 possesses a reaction vessel 10 for conducting thin film formation against an object such as semiconductor wafer and the like by utilizing plasma occurring based on that the process gas G is decomposed under reduced pressure through the high frequency glow discharge, a frequency power supply 20 for supplying frequency power to generate plasma (for example, power with a predetermined frequency selected from a range of 200 KHz 300 KHz) to the reaction vessel 10 and a gas supply port 30 connected to a gas supply portion (not shown) to supply the process gas G to the reaction vessel 10.

The frequency power supply 20 has a coaxial cable 21 functioning as a transmission path to transmit the frequency power to an electrode plate 11 by electrically connecting the frequency power supply 20 and the electrode plate 11 within the reaction vessel 10, a matching device 22, a transmission plate 23, a distribution transmission plate 24 and a metallic pipe 31. Therefore, the frequency power successively flows from the frequency power supply 20 to the electrode plate 11 in the reaction vessel 10 through the coaxial cable 21, the matching device 22, the transmission plate 23, the distribution transmission plate 24, the metallic pipe 31, thereby the frequency power is supplied. In the transmission path formed as mentioned in the above, the matching device 22 conducts matching of impedance between the frequency power supply 20 and the plasma treatment space PS within the reaction vessel 10.

The transmission plate 23 protruded from the matching device 22, the distribution transmission plate 24 and an upper side portion of an electrode elevation plate 8 of the metallic pipe 31 are accommodated in a metallic shield box 25 (preventing frequency leak) and a lower portion of the electrode elevation plate 8 of the metallic pipe 31 is accommodated in an insulative communication path 26 which is surrounded by insulative dielectric. As the insulative dielectric, it can be exemplified quartz, alumina ceramic, steatite and polytetrafluoroethylene resin (PTFE). The shield box 25 is connected to the ground.

The insulative communication path 26 is provided so as to penetrate the inside and outside of the reaction vessel 10. A part thereof is protruded in the reaction vessel 10, a part thereof is protruded to the outside of the reaction vessel 10 and further a top portion of the insulative communication path 26 protruded to the outside of the reaction vessel 10 is provided so as to protrude in the shield box 25. The transmission plate 23 positioned in the shield box 25 is connected to the distribution transmission plate 24 and the matching device 22 existing inside and outside of the shield box 25. Further, the distribution transmission plate 24 is connected to the metallic pipe 31 accommodated in the insulative communication path 26. The metallic pipe 31 connecting a space between the shield box 25 and the reaction vessel 10 is covered by the insulative communication path 26, an insulative flange 39 and a metallic flange 40 and the like and sealed with vacuum. Thus, metallic pipe 31 is constituted so as not to be directly exposed to the outside. Further, an outer side of the insulative communication path 26 is covered by a metallic shield pipe 27 and the shield pipe 27 is also connected to the ground.

That is, the frequency power produced by one frequency power supply is passed through the coaxial cable 21 and is supplied to the electrode plate 11 by the metallic pipe 31 through one matching device 22 and the transmission plate 23, the distribution transmission plate 24.

The electrode plate 11, in the present embodiment, has a constitution in which four plate shape members of a main electrode plate 12, a first diffuser plate 13, a second diffuser plate 14 and a shower plate 15 are sequentially provided side by side so that the plane of each plate becomes parallel and an end of each plate is mutually linked, thereby each plate is electrically connected. Here, a stage 17 becoming a counter electrode of the electrode plate 11 (on which a substrate tray 16 mentioned later is mounted) is connected to the ground.

In the electrode plate 11, the shower plate 15, the second diffuser plate 14, the first diffuser plate 13 and the main electrode plate 12 are provided in this order from a near side of the state 17 of the counter electrode. The main electrode plate 12 has a peripheral wall portion 12a of the main electrode plate which is protruded in a stepwise fashion toward the stage 17 in a peripheral edge portion, thereby the peripheral wall portion 12a is formed in a container shape in which a side of the stage 17 of the counter electrode is opened.

The first diffuser plate 13, the second diffuser plate 14 and the shower plate 15 are respectively linked to an inner wall in a stepwise fashion of the peripheral wall portion 12a of the main electrode plate 12 and are electrically connected. A space between each plate constitutes a substantially sealed space sealed by an adjacent plate plane and the peripheral wall portion 12a of the main electrode plate except for small hole (mentioned later) formed in the first diffuser plate 13, the second diffuser plate 14 and the shower plate 15. Hereinafter, a space between the main electrode plate 12 and the first diffuser plate 13 is called as a first space SP1, a space between the first diffuser plate 13 and the second diffuser plate 14 is called as a second space SP2 and a space between the second diffuser plate 14 and the shower plate 15 is called as a third space SP3.

In the electrode plate 11, a plurality of small holes 13a, 14a and 15a are respectively formed in the first diffuser plate 13, the second diffuser plate 14 and the shower plate 15 so that the small holes penetrate front and back of the plate 13, 14 and 15. Gas (process gas) can communicate front and back of each plate through a plurality of small holes 13a, 14a and 15a in each plate.

The process gas G supplied from a gas supply portion (not shown) is supplied to the electrode plate 11 in the reaction vessel 10 through a gas supply port 30 a gas pipe 32, a gas distribution pipe 33, connection fittings 34, an insulative pipe 35, connection fittings 36 and the metallic pipe 31. The process gas G supplied to the electrode plate 11 in the reaction vessel 10 is further supplied to the first space SP1 between the main electrode plate 12 and the first diffuser plate 13. The process gas G supplied to the first space SP1 passes the small holes 13a of the first diffuser plate 13 and flows out in the second space SP2. The process gas of the second space SP2 passes the small holes 14a of the second diffuser plate 14 and flows out to the third space SP3. The process gas G of the third space SP3 is supplied to the plasma treatment space PS between the electrode plate 11 and the stage 17 (on which the substrate tray 16 is mounted) of the counter electrode from the small holes 15a of the shower plate 15. The process gas G is decomposed and excited by the glow discharge between the electrode plate 11 and the stage 17 (on which the substrate tray 16 is mounted) of the counter electrode, thereby the process gas G changes to the active species (plasma).

Within the reaction vessel 10, it is provided the stage 17 of the counter electrode having a surface facing to a side of the shower plate 15 of the electrode 11. On the stage 17, the substrate tray 16 is mounted. In the stage 17, a heater for heating the substrate is built and the stage 17 is connected to the ground. The stage 17 constituted in the above can heat the surface and the substrate tray 16 mounted on the surface, further a semiconductor substrate and the like mounted on the substrate tray 16 within a desired temperature range. The surface of the stage 17 and the substrate tray 16 mounted thereon are formed wider than the electrode 11.

The plasma treatment device 1 has a drive mechanism (not shown) to adjust a distance between the electrode 11 and the surface of the stage 17, thereby the height of the plasma treatment space PS formed between the electrode 11 and the surface of the stage 17 can be adjusted in a desired height.

In the example shown in FIG. 2, the matching device 22 and the shield box 25 are set on the electrode elevation plate 8 and the electrode elevation plate 8 is mounted on a vertical drive mechanism (not shown) which is set on a reaction vessel lid 9. Based on this mechanism, an upper electrode portion (whole upper portion except for the reaction vessel lid 9 and a welded bellows pipe 37) can be moved vertically. On the other hand, the stage 17 in the reaction vessel 10 is fixed on a set position (fixation mechanism is not shown) and connected to the ground.

At that time, around outer side of the insulative communication path 26 and shield pipe 27 covering outer side thereof, the welded bellows pipe 37 exists, thereby a space between the electrode elevator plate 8 on which the shield box 25 is mounted and the reaction vessel lid 9 is telescopically sealed and connected though the welded bellows pipe 37 (bellows-shaped metallic stretchable pipe). Thereby, when the electrode elevation plate 8 is vertically moved, height of the plasma treatment space PS formed between the electrode plate 11 and the surface of the stage 17 in the reaction vessel 10 can be adjusted in a desired height while retaining degree of vacuum between the shield box 25 and the reaction vessel 10.

Here, at any position in a bottom portion of the reaction vessel 10, a vacuum exhaust port (not shown) is provided and a vacuum pump (not shown) is linked to the vacuum exhaust port. Between the vacuum exhaust port and the vacuum pump, there are installed a main exhaust valve, a bypass exhaust valve and APC (Auto Pressure Controller) and the like (not shown). Further, unreacted process gas in the plasma treatment space PS while conducting plasma treatment and active species flow out from peripheral clearance with a width d2 (gap for confining plasma) and pass the vacuum exhaust port, thereafter are exhausted to outside of the reaction vessel 10.

In the example shown in FIG. 3, flow rate control of supply of the process gas G to the reaction vessel 10 is conducted through a gas pressure (pressure reducing valve), MFC (Mass Flow Controller) and air operated valve (not shown) and the like in the gas supply portion (no shown) and the gas supply portion is connected to the metallic pipe 31 with a tubular gas supply path GP through the gas supply port 30, the gas pipe 32, the gas distribution pipe 33, the connection fittings 34, the insulative pipe 35 and the connection fittings 36. The metallic pipe 31 is provided within the insulative communication path 26. In this metallic gas supply path GP, at an exposed portion in the shield box 25 from an end portion of the insulative communication path 26, the distribution transmission plate 24 (described later) formed by metallic plate is connected though a nut 38. Further, to the transmission plate 23, the matching device 22 and the metallic pipe 31 are connected through the distribution transmission plate 24 and the transmission plate 23 constitutes a part of the transmission path so as to supply frequency power to the electrode plate 11 from the matching device 22.

To the metallic pipe 31 protruded in the shield box 25, the insulative pipe 35 is connected by the connection fittings 36 and a top end of the insulative pipe 35 is connected to the gas distribution pipe 33 by the connection fittings 34, further the gas distribution pipe 33 is connected to the outer gas supply port by the gas pipe 32. Thereby, the process gas G supplied from the gas supply port 30 passes the gas supply path GP in the metallic pipe 31 and is supplied to the plasma treatment space PS in the reaction vessel 10.

The metallic pipe 31 constituting a part of the frequency power transmission path is electrically connected to each of the main electrode plate 12, the first diffuser plate 13, the second diffuser plate 14 and the shower plate 15, constituting the electrode plate 11. Thereby, the frequency power is supplied to the main electrode 12, the first diffuser plate 13, the second diffuser plate 14 and the shower plate 15. Here, by respectively connecting the metallic pipe 31 to each plate of the electrode plate 11, each plate of the electrode plate 11 is supported under a state that each plate is suspended to the metallic pipe 31. A lower top end of the metallic pipe 31 is processed in a stepwise fashion and this processed dimension of the stepwise fashion is coincided with the processed dimension of the stepwise fashion of the inner wall in the peripheral wall portion 12a of the main electrode plate 12. According to these steps, the space (interval) of each plate of the electrode plate 11 is retained in its connection portion.

The metallic pipe 31 having the gas supply path GP penetrates at least the electrode plate 11 and has a first space exposed portion 31a which is exposed in the first space SP1. On the first space exposed portion 31a, a plurality of gas ejection holes 31b (6~8 holes) are radially formed at regular intervals along a peripheral direction. The gas ejection holes 31b are communicated with the gas supply path GP formed along a length direction (vertical direction) in the metallic pipe 31. Thereby, the process gas G ejected from the gas ejection hole 31b is ejected along a substantial plane direction of the main electrode plate 12 and the first diffuser plate 13 in the first space SP1. Here, the gas supply path GP formed along a length direction (vertical direction) within the metallic pipe 31 is closed except for the gas supply port 30 and the gas ejection hole 31b in the metallic pipe 31.

FIGS. 3 and 4 are views to explain a plurality of holes of each plate constituting the electrode plate 11. FIG. 5 is a view showing planar position relation of a plurality of small holes of each plate. In each plate, all of a plurality of small holes are distributed without fails over the plate.

A plurality of small holes of the first diffuser plate 13, the second diffuser plate 14 and shower plate 15 are formed with a position relation different from those of the plate adjacently arranged in a planar view. That is, a plurality of small holes 13a of the first diffuser plate 13 are formed at positions where the small holes 13a do not overlap with a plurality of small holes 14a of the second diffuser plate 14 and the small holes 14a of the second diffuser plate 14 are formed at positions where the small holes 14a do not overlap with a plurality of small holes 15a of the shower plate 15. Here, in FIGS. 3~5, it is shown an example that the small holes formed in any of the first diffuser plate 13, the second diffuser plate 14 and the shower plate 15 are formed with a position relation that the small holes do not mutually overlap in a planar view.

Thereby, the process gas G flowing into the second space PS2 after passing a plurality of small holes 13a from the first space SP1 is diffused in a plane direction along the second diffuser plate 14 and the process gas G flowing into the third space SP3 after passing a plurality of small holes 14a from the second space SP2 is diffused in a plane direction along the shower plate 15. Therefore, until the process gas G ejected in substantially every direction along a plane direction of the electrode plate 11 from the gas ejection hole 31b reaches the plasma treatment space SP from the first space SP1, the second space SP2 and the third space SP3, dispersity of the process gas G in a plane direction every passing small holes of each plate can be improved, thereby uniformity of gas distribution can be gradually improved.

Here, it is desirable to design so that a relation of "R1>R2>R3" is established among a diameter R1 of the plural small holes 13a of the first diffuser plate 13, a diameter R2 of the plural small holes 14a of the second diffuser plate 14 and a diameter R3 of the plural small holes of the shower plate 15. Further, it is desirable to be established a relation "H1<H2<H3" among an aperture rate H1 of the first diffuser plate 13 based on the plural small holes 13a, an aperture rate H2 of the second diffuser plate 14 based on the plural small holes 14a and an aperture rate H3 of the shower plate 15 based on the plural small holes 15a. As mentioned, by adjusting the diameter and the aperture rate of the plural holes in each plate, dispersity of the process gas G in a plane direction can be reasonably improved. Concretely, supposed that R1 is 1.5 mm~3.0 mm, R2 becomes to an extent of 0.8 mm~2.5 mm and R3 becomes to an extent of 0.5 mm~1.5 mm.

Further, it is desirable to design so that a relation "D1>D2≈D3" is established among an interval D1 between the main electrode plate 12 and the first diffuser pate 13, an interval D2 between the first diffuser plate 13 and the second diffuser plate 14 and an interval D3 between the second diffuser plate 14 and the shower plate 15. That is, it is desirable that the interval between the main electrode plate 12 and the first diffuser plate 13 is made wider than the interval between the first diffuser plate 13 and the second diffuser plate 14 or the interval between the second diffuser plate 14 and the shower plate 15. Thereby, as for the process gas G introduced between the main electrode plate 12 and the first diffuser plate 13, degree of freedom of flow in a plane direction is improved and diffusion ability in wide area is emphasized. On the other hand, between the shower plate 15 and the second diffuser plate 14 and between the first diffuser plate 13 and the second diffuser plate, it is adopted a structure to emphasize local diffusion ability that the process gas G flowing out from the plural small holes of an upstream side plate is distributed to the plural small holes of a downstream side plate existing near the plural small holes of the upstream side plate. Thereby, gas dispersion in the first to the third space due to flowing in and flowing out of the process gas G can be suitably adjusted.

An upper surface and a side surface of the electrode plate 11 are covered with a close contact state by an insulative plate 18 as an insulator with a container shape formed by dielectric. Further, an insulative plate peripheral wall portion 18a covering a side surface of the electrode plate 11 is formed in a length extending in a lower direction by a predetermined amount than a lower end of the electrode plate 11. Thereby, the electrode plate 11 is arranged in a fit state to an inner bottom of container shape structure opened in a lower direction, the structure being formed by the insulative plate 18 covering the upper surface and the side surface of the electrode plate 11 and the insulative plate peripheral wall portion 18a. Further, the insulative plate 18 is continuously connected to the insulative communication path 26 mentioned in the above. Here, as shown in FIG. 2, the insulative plate peripheral wall portion 18a is provided at a hole edge portion of the insulative plate 18 and it is formed at an inner side corner of the hole edge portion a taper portion 18b which is widened toward a lower direction. A hole diameter near the hole edge portion in a lower portion of the insulative plate 18 is gradually widened based on the taper portion 18b as going to the lower direction. That is, the hole diameter near the hole edge portion is gradually widened as approaching a hole formed at an lower end of the insulative plate 18 based on that the taper portion 18b is widened toward the lower direction.

At least a part of an upper surface of the insulative plate 18 and a side surface continuing from the upper surface is covered by a metallic shield plate 19. This shield plate 19 is connected to a shield pipe 27 covering a side surface of the insulative communication path 26 mentioned in the above and connected to the ground. As mentioned, the electrode plate 11 is covered by the insulative plate 18, the insulative plate peripheral wall portion 18a and the shield plate 19, thereby glow discharge occurring on an upper surface and a side surface of the electrode plate 11 can be prevented and film formation to an outer peripheral (inner surface wall of the reaction vessel 10 and the reaction vessel lid 9) can be prevented. Of course, it is similar in a side surface of the insulative communication path 26 continuously connected to this. Further, the object of shield is to prevent static electricity charging up on a surface of the dielectric insulator and the dielectric insulator is connected to the ground.

Here, when a state that plasma treatment is done occurs against the stage 17 of the counter electrode mounting the electrode plate 11 and the substrate tray 16 (object substrate n is mounted), a space between the electrode plate 11 and the substrate tray 16 is adjusted so that a peripheral space d2 of a protrusion end portion of a lower top portion of the insulative plate peripheral wall portion 18a and the substrate tray 16 becomes narrower than a protrusion length d1 (length of hole edge portion protruded from a peripheral wall portion lower top end of the shield plate 19) of a lower top portion of the insulative plate peripheral wall portion 18a. The peripheral space d2 is, for example, made to an extent of 3~15 mm. Further, the peripheral space d2 of the lower top portion of the insulative plate peripheral wall portion 18a and the substrate tray 16 is uniformly made parallel and is substantially uniform. Thereby, except for a lower surface (shower plate 15 side) of the electrode plate 11, all of outer peripheral portion are covered by the insulative plate 18 and the insulative plate peripheral wall portion 18a and the plasma treatment space PS is closed remaining a peripheral space of the width d2. To the process gas G in the plasma treatment space PS, glow discharge occurs by adding the frequency power and the process gas G is decomposed and excited by glow discharge, thereby plasma (ionized gas) is produced. This plasma can be confined in the plasma treatment space PS.

The frequency power supply 20 is connected to the matching device 22 through the coaxial cable 21 and is connected to the electrode plate 11 from the matching device 22 through the transmission plate 23, the distribution transmission plate 24 and the metallic pipe 31. The distribution transmission plate 24 has branch portions branched in all directions and each branch portion is connected to the metallic pipe 31. The matching device 22 and the distribution transmission plate 24 is connected by one transmission plate 23. Thereby, frequency power output from one frequency power supply 20 can be parallel input to a plurality of portions of the electrode plate 11 electrically and integrally constituted.

Figure 10:
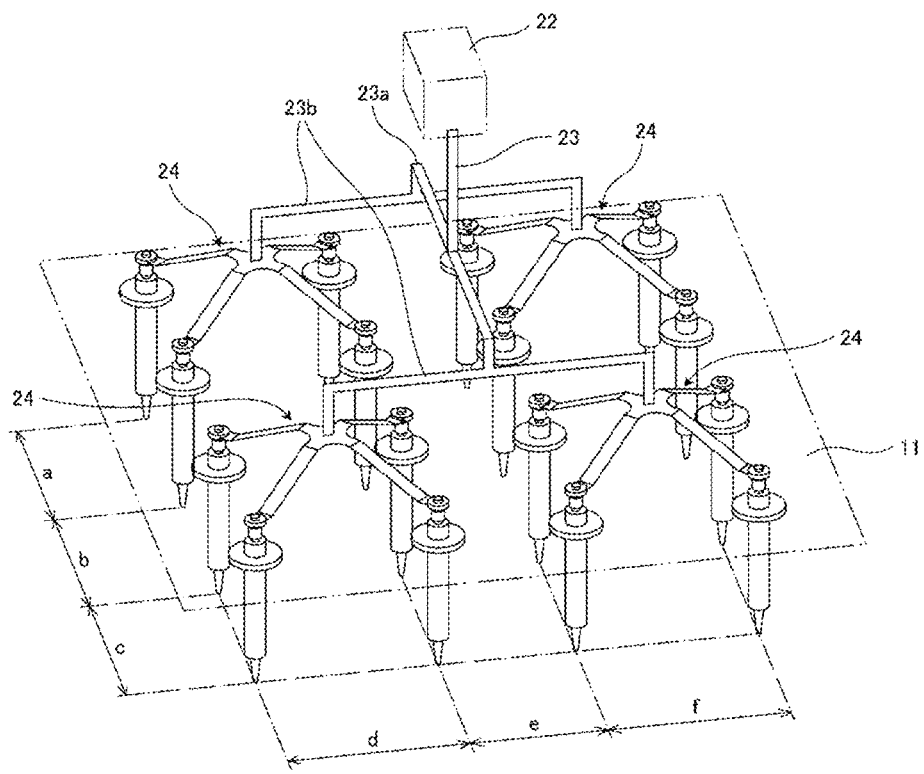
FIG. 10 is a view to explain an example of branch structure of the transmission path in which a plurality of branches are formed in a multistage manner.
Figure 11:
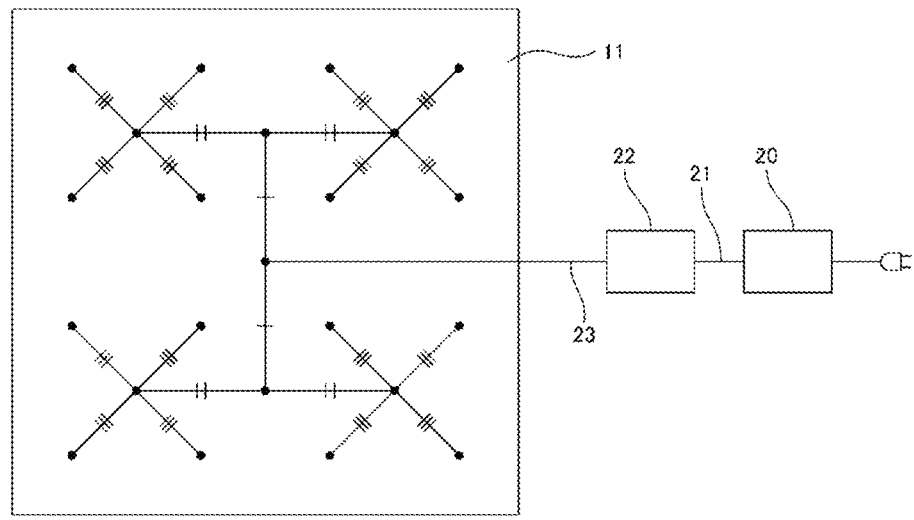
FIG. 11 is a view showing lengths after branched in FIG. 10 by utilizing equal length codes similarly to a circuit diagram.

Here, in the present embodiment, it will be explained according to an example in which the distribution transmission plate 24 and the metallic pipe 31 are connected by four branch portions of the distribution transmission plate 24. Further, as mentioned later, connection portions of the electrode plate 11 and the metallic pipe 31 may be increased. At that time, although the transmission plate 23 to connect the matching device 22 and the distribution transmission plate 24 is one, it may be adopted a constitution in which new distribution transmission plates (23a, 23b, 23c) are added between the transmission plate 23 and the distribution transmission plate 24, a plurality of branches are provided step by step, thereby the matching device 22 and the distribution transmission plate 24 are connected (see FIGS. 8, 10, 12).

Figure 6:
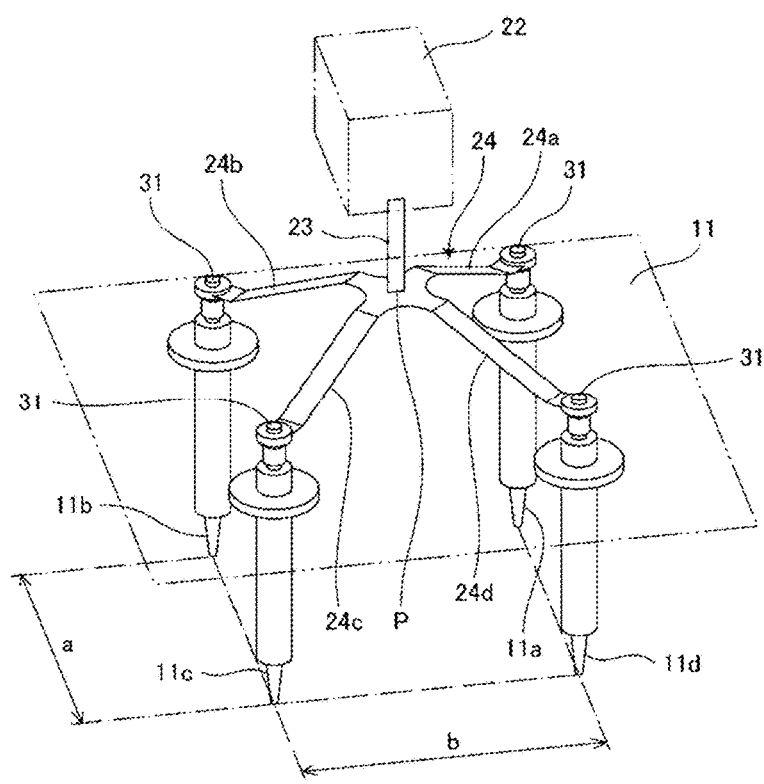
FIG. 6 is a view schematically showing transmission paths between a matching box and an electrode plate, the transmission paths being separated.
Figure 7:
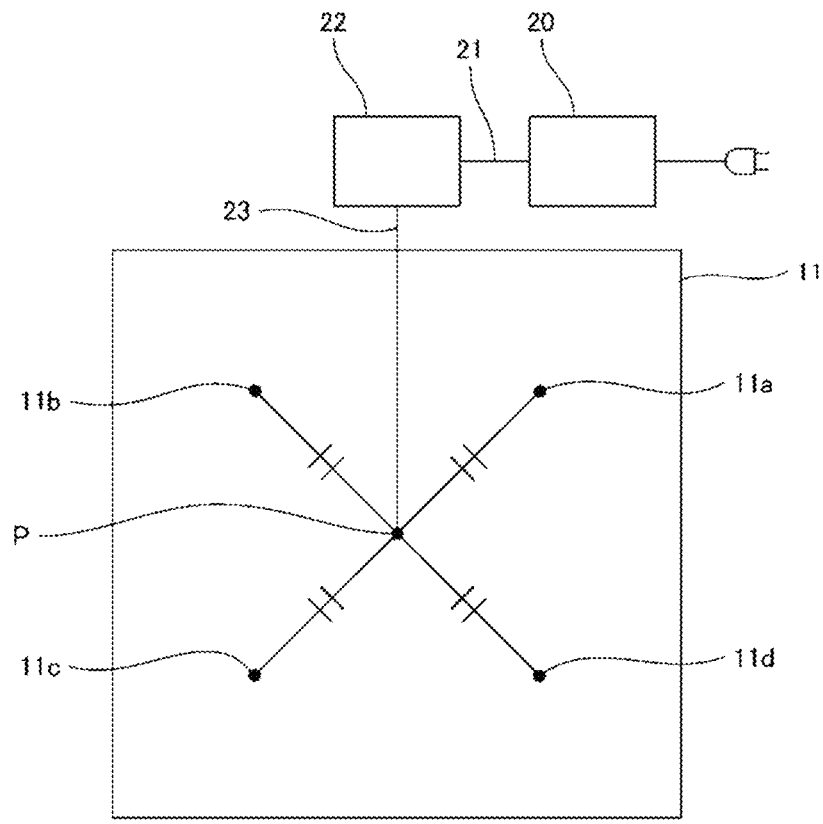
FIG. 7 is a view showing lengths after branched in FIG. 6 by utilizing equal length codes similarly to a circuit diagram.

Connection portions 11a~11d of the electrode plate 11 and the metallic pipe 31, in a planar view of the electrode plate 11, are provided at substantial centers of each of plural divided areas (FIGS. 8~13) which are substantially equally divided corresponding to a number of branches from the transmission plate 23. In FIG. 6, connection between the matching device 22 and the electrode plate 11 through the transmission plate 23, the distribution transmission plate 24 and the metallic pipe 31 is indicated by a three-dimensional schematic view, and FIG. 7 is an outline planar view in which the transmission plate 23, the distribution transmission plate 24 of FIG. 6 are connected to the electrode plate 11 through the metallic pipe 31. In FIG. 7, a branch length of the distribution transmission plate 24 is shown by the equal length code.

In the example shown in FIGS. 6 and 7, each of the connection portions 11a~11d is provided in each of the division areas respectively divided in a substantial square. A plurality of branch plates 24a~24d of the distribution transmission plate 24 are formed so that a width, a length, a thickness and a resistance value of each branch plate 24a~24d become substantially equal and are adjusted so that electrical properties such as a line path length of the transmission path respectively connecting the matching device 22 and the connection portions 11a~11d of the metallic pipe 31 and impedance become equivalent.

In the example shown in FIG. 6, the transmission plate 23 and the distribution transmission plate 24 connected to the matching device 22 are metallic plates. In the distribution transmission plate 24, four featherlike orthogonal branch plates (24a, 24b, 24c and 24d) extend in all directions from a branch position P and are linked to head top portions of the metallic pipe 31 by nuts 38. That is, the frequency power output from one frequency power supply 20 passes the coaxial cable 21, is connected to the matching device 22, is branched in all directions in the distribution transmission plate 24 through the transmission plate 23, is connected to the head top portions of each metallic pipe 31 by the nut 38, and is supplied to one electrode plate 11 (the main electrode plate 12, the first diffuser plate 13, the second diffuser plate 14 and the shower plate 15 are connected, thereby an electrically integral electrode plate is constituted) which is linked so as to become electrically integral through the connection portions 11a~11d of each metallic pipe 31.

Thereby, frequency of the frequency power input into a plurality of portions of the electrode plate 11 becomes constant and moreover phase of the frequency power input to the connection portions 11a~11d of the electrode plate 11 mutually coincides. Therefore, based on that the length of the branch plates (24a, 24b, 24c and 24d) of the distribution transmission plate 24 and positions (installation distances) of the connection portions 11a~11d of the electrode plate 11 are determined corresponding to the frequency of the frequency power supply 20, the standing wave occurring in the plasma treatment space PS can be restrained and uniformity of glow discharge can be easily improved. In FIGS. 6, 8, 10 and 12, connection distances of the connection portions 11a~11d of the electrode plate 11 are indicated by a~j. All of a~j is set to a distance less than ¼λ.

Figure 8:
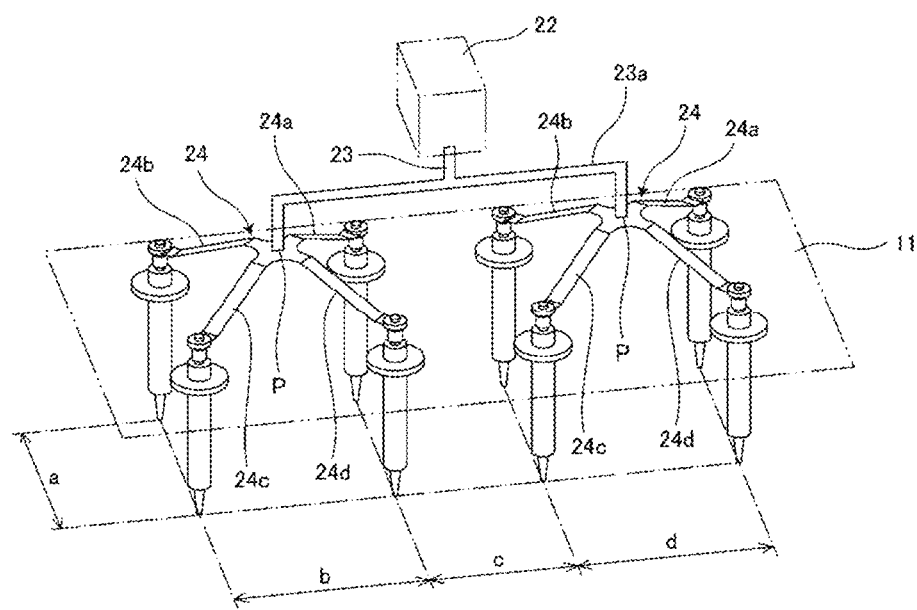
FIG. 8 is a view to explain an example of branch structure of the transmission path in which a plurality of branches are formed in a multistage manner.
Figure 9:
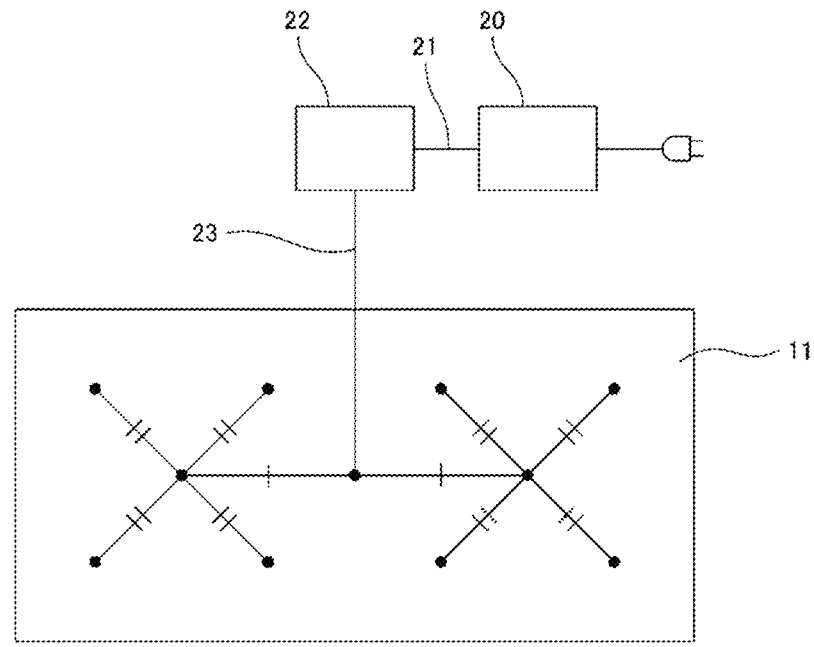
FIG. 9 is a view showing lengths after branched in FIG. 8 by utilizing equal length codes similarly to a circuit diagram.
Figure 12:
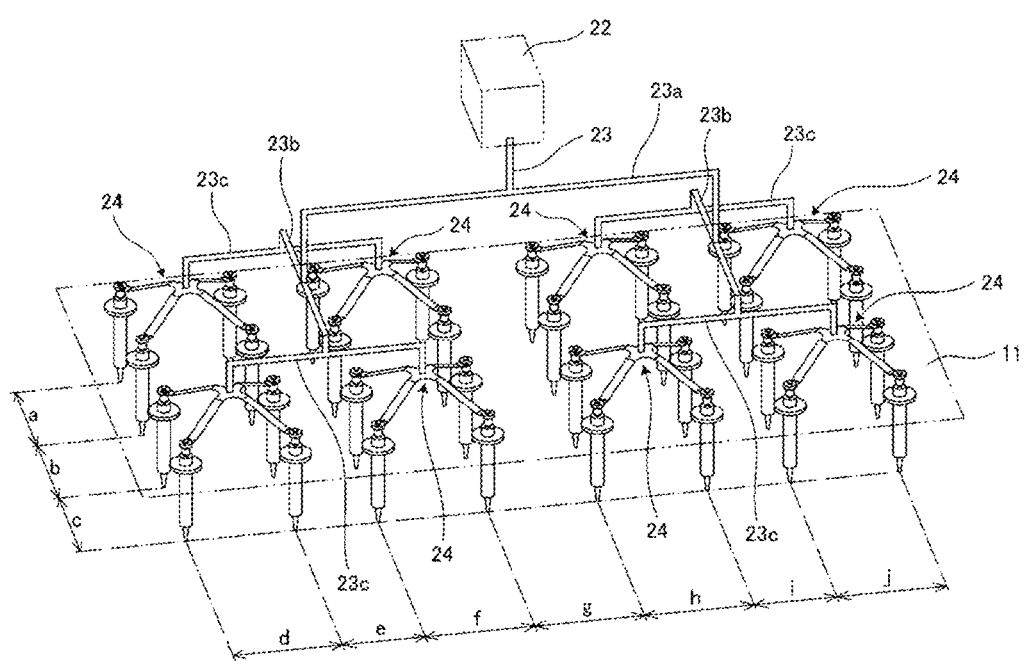
FIG. 12 is a view to explain an example of branch structure of the transmission path in which a plurality of branches are formed in a multistage manner.
Figure 13:
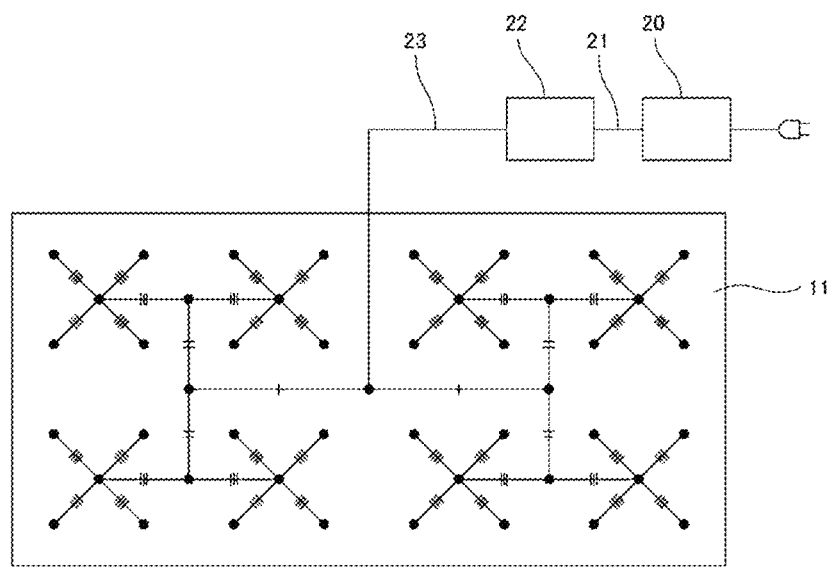
FIG. 13 is a view showing lengths after branched in FIG. 12 by utilizing equal length codes similarly to a circuit diagram.

According to the branch structure described in the above, based on that a plurality of branch portions in a multistage manner, a number of the connection portions to the electrode plate 11 can be increased as mentioned in the above, that is, portions to supply the frequency power to the electrode plate 11 can be increased. FIGS. 8~13 are views to explain an example of the branch structure of the transmission path provided in the plural branch portions in a multistage manner. In FIGS. 8 and 9, two branch portions are formed step by step, bifurcation is formed in the first stage and fork branch is formed in the second stage, similarly to the above example. Thereby, as a whole, the branch structure having 8 branch portions can be realized. Similarly, in FIGS. 10 and 11, three branch portions are formed step by step, bifurcation is formed in both the first stage and the second stage and fork branch is formed in the third stage, similarly to the above example. Thereby, as a whole, the branch structure having 16 branch portions can be realized. In FIGS. 12 and 13, four branch portions are formed step by step, bifurcation is formed in the first stage to the third stage and fork branch is formed in the fourth stage, similarly to the above example. Thereby, as a whole, the branch structure having 32 branch portions can be realized. As mentioned, by increasing the number of branches, the number of the connection portions of the electrode plate 11 and the transmission path 23 can be increased or decreased as appropriate. Therefore, even if the frequency power shifts to higher frequency and/or area of the electrode plate 11 is further increased to correspond to increase of film formation area, uniform glow discharge can be realized in the electrode plate 11.

Figure 14:
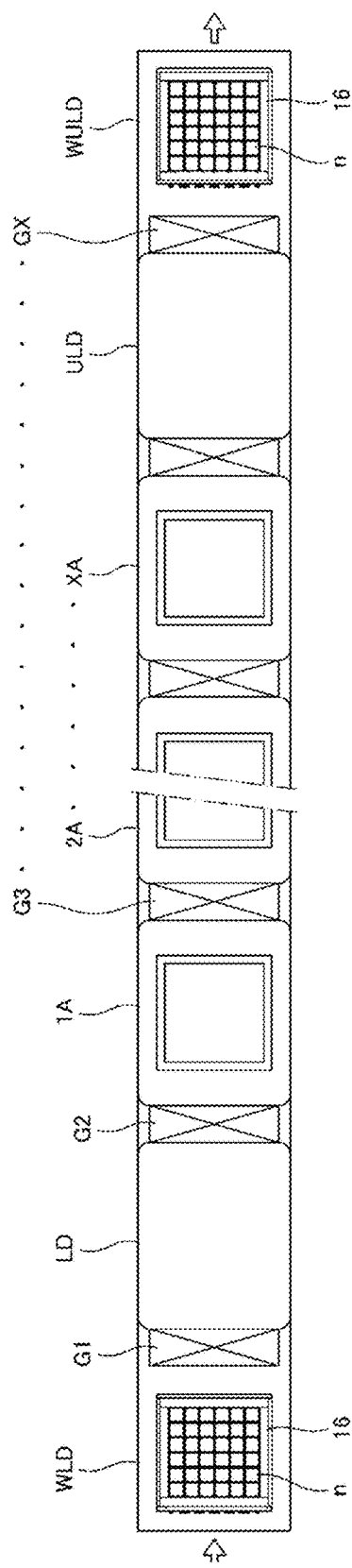
FIG. 14 is a view showing an example of the plasma treatment system for mass production.
Figure 15:
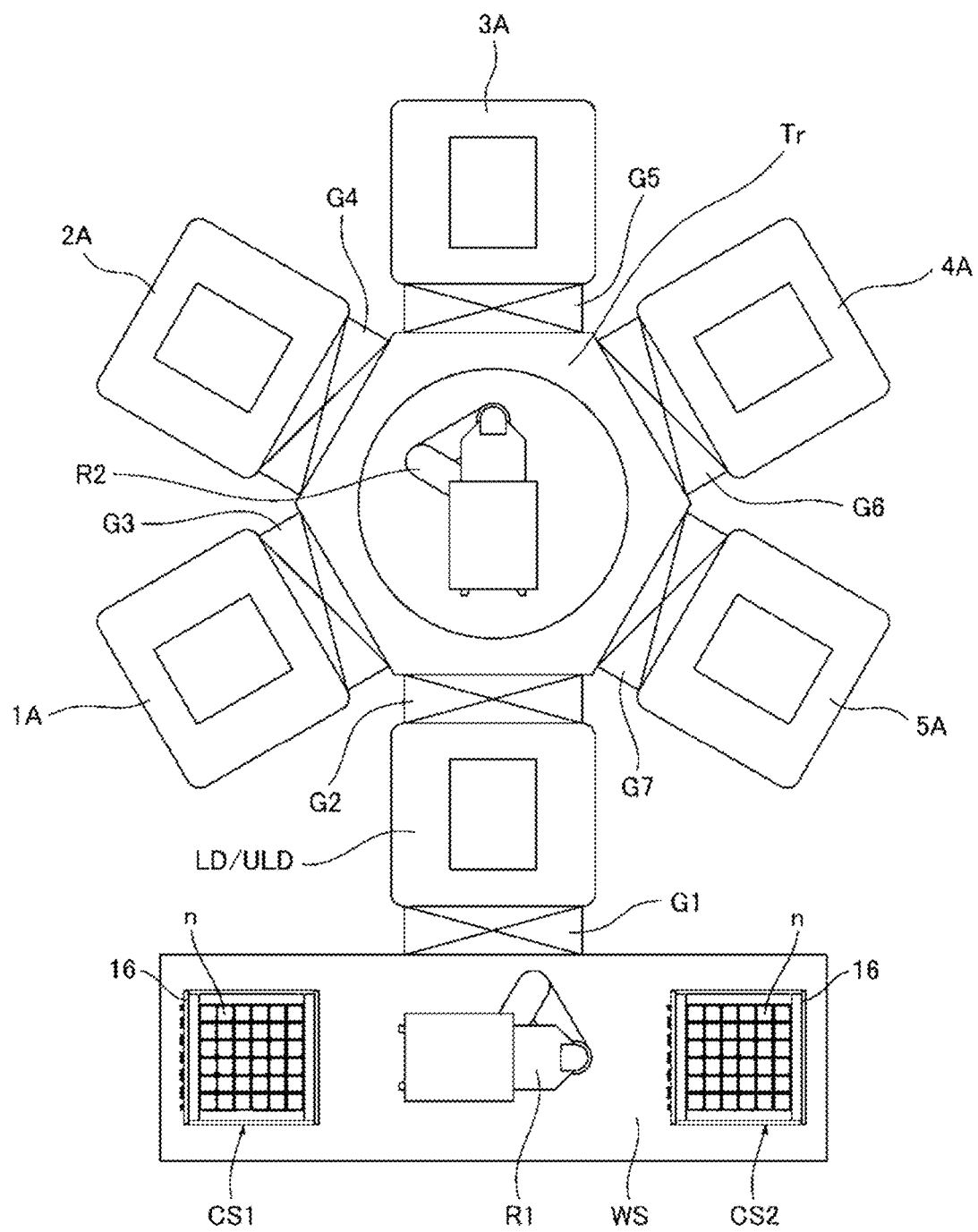
FIG. 15 is a view showing an example of the plasma treatment system for mass production.

Although film formation treatment by using a single plasma treatment device is as the above, when the plasma treatment device 1 is actually used, as shown FIGS. 14 and 15, it is used as a plasma treatment system in which a plurality of plasma treatment devices 1A~XA (X is a natural number) are arranged in series or in parallel. FIG. 14 shows a plasma treatment system of inline manner and FIG. 15 is a plasma treatment system of cluster manner. Hereinafter, the plasma treatment system of inline manner shown in FIG. 14 will be described.

A substrate n conveyed from a previous process is mounted on the substrate tray 16 of a work loader WLD. The substrate tray 16 on which the substrate n is mounted opens a gate valve G1 (OPEN) and is conveyed to a load lock room LD. Thereafter the gate valve G1 is closed (CLOSE) and the load lock room LD is drawn a vacuum. When the load lock room LD reaches the degree of vacuum as same as that of the plasma treatment device 1A, a gate valve G2 is opened (OPEN) and the substrate tray 16 is conveyed to the plasma treatment device 1A, thereafter the gate valve G2 is closed (CLOSE). After the process gas G a flow rate of which is controlled is supplied (ON) and is adjusted to a process pressure, the frequency power is added (ON) to the plasma treatment device 1A, thereafter the plasma treatment (film formation) is started. At that time, the stage 17 is adjusted to a process temperature (optimal substrate temperature) which is set beforehand. Further, after the gate valve G2 is closed (CLOSE), the load lock room LD is returned to atmospheric pressure. The gate valve G1 is opened (OPEN) and the substrate tray on which the next substrate n is set is conveyed to the load lock room LD. After the plasma treatment (film formation) is finished in the plasma treatment device 1A, supply of the process gas G and the frequency power are stopped (OFF). After residual gas within the plasma treatment device 1A is exhausted, the substrate tray 16 is conveyed to the next plasma treatment device 2A and treatment (film formation) is continuously repeated, thereafter the substrate tray 16 is conveyed to an unload lock room ULD. After the unload lock room ULD is returned to atmospheric pressure, the substrate tray 16 conveyed to the unload lock room ULD opens a final gate valve GX (X is a natural number) (OPEN) and is carried out to a work unloader WULD. The final gate valve GX is closed (CLOSE) and the unload lock room is drawn a vacuum and the system waits. At the same time, the substrate n is taken out at the work unloader WULD and the substrate n which is taken out is shifted to the next process. The substrate tray 16 from which the substrate n is taken out is returned to the work loader WLD by a return mechanism. As mentioned, treatment (film formation) is sequentially conducted.

The present invention is not limited to the embodiment described in the above and it is included a constitution in which each constitution disclosed in the above embodiment is mutually substituted or combination thereof is changed, or a constitution in which prior art and each constitution disclosed in the above embodiment are mutually substituted or combination thereof is changed. Further, technical scope of the present invention is not limited to the above embodiment and includes both technical matter described in claims of the present invention and equivalents.

REFERENCE SIGNS

1: plasma treatment device, 8: electrode elevation plate, 9: reaction vessel lid, 10: reaction vessel, 11: electrode plate, 11a~11d: connection portion, 12: main electrode plate, 12a: main electrode plate peripheral wall portion, 13: first diffuser plate, 13a: small hole, 14: second diffuser plate, 14a: small hole, 15: shower plate, 15a: small hole, 16: substrate tray, 17: stage, 18: insulative plate, 18a: insulative plate peripheral wall portion, 19: shield plate, 20: frequency power supply, 21: coaxial cable, 22: matching device, 23: transmission plate, 23a~23c: distribution transmission plate, 24: distribution transmission plate, 24a~24d: branch plate, 25: shield box, 26: insulative communication path, 27: shield pipe, 30: gas supply port, 31: metallic pipe, 31a: first space exposed portion, 31b: gas ejection port, 32: gas pipe, 33: gas distribution pipe, 34, 36: connection fittings, 35: insulative pipe, 37: welded bellows pipe, 38: nut, 39: insulative flange, 40: metallic flange, G: process gas, GP: gas supply path, PS: plasma treatment space, SP1: first space, SP2: second space, SP3: third space, P: branch point, R1: diameter of small hole 13a, R2: diameter of small hole 14a, R3: diameter of small hole 15a, H1: first diffuser plate aperture ratio, H2: second diffuser plate aperture ratio, H3: shower plate aperture ratio, n: substrate, λ: wavelength, 1A~XA: plasma treatment device, G1~GX: gate valve, WLD: work loader, WULD: work unloader, LD: load lock room, ULD: unload lock room

The invention claimed is:

1. A plasma treatment device comprising:
   an electrode plate arranged in a reaction vessel, wherein the electrode plate comprises a main electrode plate, at least one diffuser plate, and a shower plate;
   a counter electrode arranged parallel so as to be opposite to the electrode plate in the reaction vessel;
   a transmission path to supply frequency power to the electrode plate from outside of the reaction vessel, the transmission path being connected from non-opposite side not opposing to the counter electrode of the electrode plate; and
   an insulator with a lid shape, the insulator being arranged in the reaction vessel and storing the electrode plate therein,
   wherein the transmission path comprises a metallic pipe, wherein the metallic pipe is configured to distribute a process gas therethrough, wherein the metallic pipe penetrates all of the main electrode plate, the diffuser plate, and the shower plate in the electrode plate, wherein the metallic pipe is electrically conductively connected to all of the main electrode plate, the diffuser plate, and the shower plate in the electrode plate at an area where the metallic pipe penetrates the electrode plate, and wherein the electrode plate is suspended to the metallic pipe, and such that the process gas is changed to plasma between the electrode plate and the counter electrode,
   wherein the non-opposite side of the electrode plate closely contacts to an inner bottom surface of the insulator with the lid shape, and
   wherein a side surface of the electrode plate closely contacts to an inner side surface of the insulator with the lid shape.

2. The plasma treatment device according to claim 1, wherein a hole edge portion of the insulator with the lid shape is formed so as to protrude toward a counter electrode side, and
   wherein in the insulator with the lid shape, a hole diameter near the hole edge portion becomes gradually wider as the hole diameter approaches towards the counter electrode, based on a taper portion formed in an inner corner portion of the hole edge portion.

3. The plasma treatment device according to claim 2,
wherein a clearance between the electrode plate and the counter electrode is adjustable, and
wherein a plasma treatment is conducted under a state that the clearance between the electrode plate and the counter electrode is adjusted so that a clearance d2 between a protrusion end of the hole edge portion and the counter electrode becomes narrower than a protrusion length d1 of the hole edge portion protruded from a facing surface which opposes to the counter electrode side.

4. The plasma treatment device according to claim 3, wherein the clearance between the electrode plate and the counter electrode is adjustable by moving the electrode plate.

5. The plasma treatment device according to claim 1,
wherein the counter electrode serves as a tray mounting an object of a plasma treatment,
wherein the process gas flows out toward the counter electrode from the electrode plate, and
wherein the counter electrode is formed wider than the insulator with the lid shape.

6. The plasma treatment device according to claim 1, further comprising a metallic shield plate, a shield pipe, and an insulative communication path,
wherein the metallic shield plate covers at least a part of an upper surface or a side surface of the insulator,
wherein the metallic shield plate is connected to a ground via the shield pipe,
wherein the shield pipe covers a side surface of the insulative communication path, and
wherein the insulative communication path is connected to the insulator.

7. The plasma treatment device according to claim 6, wherein an end of the insulator protrudes toward the counter electrode more than an end of the shield plate.

8. The plasma treatment device according to claim 1,
wherein the main electrode plate comprises a peripheral wall portion formed in a stepwise fashion toward the counter electrode, and
wherein an inner wall of the peripheral wall portion is electrically connected to the at least one diffuser plate, and thereby a substantially-sealed space is formed.

9. A structure of reaction vessel for plasma treatment comprising:
an electrode plate arranged in a reaction vessel, wherein the electrode plate comprises a main electrode, at least one diffuser plate, and a shower plate;
a counter electrode arranged parallel so as to be opposite to the electrode plate in the reaction vessel;
a transmission path to supply frequency power to the electrode plate from outside of the reaction vessel, the transmission path being connected from non-opposite side not opposing to the counter electrode of the electrode plate; and
an insulator with a lid shape, the insulator being arranged in the reaction vessel and storing the electrode plate therein,
wherein the transmission path comprises a metallic pipe,
wherein the metallic pipe is configured to distribute a process gas therethrough, wherein the metallic pipe penetrates all of the main electrode plate, the diffuser plate, and the shower plate in the electrode plate, wherein the metallic pipe is electrically conductively connected to all of the main electrode plate, the diffuser plate, and the shower plate in the electrode plate at an area where the metallic pipe penetrates the electrode plate, and wherein the electrode plate is suspended to the metallic pipe, and such that the process gas is changed to plasma between the electrode plate and the counter electrode,
wherein the non-opposite side of the electrode plate closely contacts to an inner bottom surface of the insulator with the lid shape, and
wherein a side surface of the electrode plate closely contacts to an inner side surface of the insulator with the lid shape.

10. The A structure of reaction vessel for plasma treatment according to claim 9,
wherein a hole edge portion of the insulator with the lid shape is formed so as to protrude toward a counter electrode side, and
wherein in the insulator with the lid shape, a hole diameter near the hole edge portion becomes gradually wider as the hole diameter approaches towards the counter electrode, based on a taper portion formed in an inner corner portion of the hole edge portion.

11. A plasma treatment device comprising:
an electrode plate arranged in a reaction vessel, wherein the electrode plate comprises a main electrode plate and at least one diffuser plate;
a counter electrode arranged parallel so as to be opposite to the electrode plate in the reaction vessel;
a transmission path to supply frequency power to the electrode plate from outside of the reaction vessel, the transmission path being connected from non-opposite side not opposing to the counter electrode of the electrode plate; and
an insulator with a lid shape, the insulator being arranged in the reaction vessel and storing the electrode plate therein,
wherein the transmission path comprises a metallic pipe, wherein the metallic pipe is configured to distribute a process gas therethrough, wherein the metallic pipe penetrates the main electrode plate and the at least one diffuser plate, wherein the metallic pipe is electrically conductively connected to the main electrode plate and the at least one diffuser plate at an area where the metallic pipe penetrates the main electrode plate and the at least one diffuser plate, and wherein the electrode plate is suspended to the metallic pipe, and such that the process gas is changed to plasma between the electrode plate and the counter electrode,
wherein the non-opposite side of the electrode plate closely contacts to an inner bottom surface of the insulator with the lid shape,
wherein a side surface of the electrode plate closely contacts to an inner side surface of the insulator with the lid shape,
wherein the main electrode plate comprises a peripheral wall portion formed in a stepwise fashion toward the counter electrode,
wherein an inner wall of the peripheral wall portion is electrically connected to the at least one diffuser plate, and thereby a substantially-sealed space is formed, and
wherein a lower end of the metallic pipe is formed in a stepwise fashion, and a dimension of the stepwise fashion of the metallic pipe corresponds to a dimension of the stepwise fashion of the peripheral wall portion of the main electrode plate.

12. The plasma treatment device according to claim 11,
wherein a hole edge portion of the insulator with the lid shape is formed so as to protrude toward a counter electrode side, and wherein in the insulator with the lid shape, a hole diameter near the hole edge portion becomes gradually wider as the hole diameter approaches towards the counter electrode, based on a taper portion formed in an inner corner portion of the hole edge portion.

* * * * *